United States Patent [19]

Buser

[11] 4,078,201
[45] Mar. 7, 1978

[54] OSCILLATOR CIRCUIT FOR GENERATING A SIGNAL WHOSE FREQUENCY IS REPRESENTATIVE OF THE PHASE SHIFT OF A FOUR TERMINAL NETWORK

[75] Inventor: Werner Buser, Basel, Switzerland

[73] Assignee: BBC Brown, Boveri & Company Limited, Baden, Switzerland

[21] Appl. No.: 696,627

[22] Filed: Jun. 16, 1976

[30] Foreign Application Priority Data

Jun. 16, 1975 Switzerland .................. 7759/75

[51] Int. Cl.² .......................................... G01R 33/12
[52] U.S. Cl. .............................. 324/233; 73/362 R; 324/209; 331/65; 331/135; 331/181; 324/237
[58] Field of Search ............... 324/34 R, 34 TK, 37, 324/40; 331/65, 135, 181; 73/362 R

[56] References Cited

U.S. PATENT DOCUMENTS 3,254,311  5/1966  Collins et al. .................... 331/65

FOREIGN PATENT DOCUMENTS 1,393,165  5/1975  United Kingdom ............ 324/34 R

*Primary Examiner*—Robert J. Corcoran
*Attorney, Agent, or Firm*—Frank L. Durr; Orville N. Greene

[57] ABSTRACT

The invention concerns a measuring instrument for measuring phase shifts in four terminal electrical networks, where the network whose phase shift is to be measured is connected into the feedback circuit of an R-C phase shifter oscillator, and where the generated frequency depends on the phase shift of the four terminal network and of the RC-phase shifter, and where the circuit is so dimensioned that the following oscillation conditions are satisfied:

$$\phi(\omega) + \phi = 0 \text{ (or integral multiples of } 2\pi) \quad (1)$$

$$|F(\omega)| \cdot |H| \cdot A = 1 \quad (2)$$

where $\phi$ = phase shift of the network whose phase shift is to be measured
$\phi(\omega)$ = phase shift of the R-C phase shifter
$F(\omega)$ = damping of R-C phase shifter
$H$ = damping of network whose phase shift is to be measured
$A$ = real amplification factor and where furthermore H(p) and F(p) respectively represent the transmission function of the unknown network and of the R-C phase shifter and where A is so set by regulation that equation (2) is satisfied, and finally the network H(p) arranged in the feedback circuit is a coil assembly or a transformer.

6 Claims, 2 Drawing Figures

OSCILLATOR CIRCUIT FOR GENERATING A SIGNAL WHOSE FREQUENCY IS REPRESENTATIVE OF THE PHASE SHIFT OF A FOUR TERMINAL NETWORK

BACKGROUND OF THE INVENTION

In most known phase shift measuring methods, the zero crossings of the a-c voltages to be compared are used for measuring the phase angles between the input and output voltages. The time between the zero crossings of the voltages is then measured. As an example we mention FIG. 5.8/12 from Steinbuch: "Taschenbuch der Nachrichtenverarbeitung" Springer 1962, p. 765.

If only the zero crossings of the a-c voltages to be compared are used for measuring the phase angles, superimposed interfering voltages may make it impossible to obtain an exact measurement of the phase angle. By attaching suitable filters, the a-c voltages to be tested can be freed as far as possible of interfering voltages, but the resulting phase shift is problematic. Also, the accuracy and constancy of the trigger circuit for determining the zero passages must satisfy the highest demands.

One object of the invention is to eliminate as far as possible the disadvantage of devices which constitute the known state of the art, particularly in the measurement of the phase angle between the input and output terminals of an inductive four terminal network. It has already been suggested (dissertation by Paul Vogel, University Basle 1972 "The use of active resonant circuits for measuring phase and damping") to connect the network to be measured into the feedback circuit of an R-C phase shifted oscillator, for example, (where the generated frequency depends on the phase shift of the network and of the R-C phase shifter), and to design the circuit so that certain oscillation conditions, as substantiated above, are satisfied.

In general the transmission function F(p) of the R-C phase shifter can be realized by various networks, for example, an all-pass filter can be used with the transmission function $$F(p) = 1 - pT/1 + pT$$

wherein p is the differentiator $p = d/dt$ and wherein T is the time constant of RC phase shifter.

But if a coil assembly (i.e. a transformer defining the network whose phase is to be measured) is provided in the feedback circuit of the oscillator, the voltage surges and phase rotations occurring in the self-resonant frequencies can likewise have the result that the above oscillation conditions are satisfied (Equations 1, 2). The oscillator can thus oscillate at different frequencies, if an all-pass filter is used as a phase shifter.

BRIEF DESCRIPTION OF THE INVENTION

If a coil assembly is present in the oscillator feedback circuit, these undesired oscillations are eliminated according to the invention in such a way that the transmission function F(p) is represented by a network in the form of a three-member, decoupled R-C low-pass filter according to the transfer function $$F(p) = 1/(1+pT)^3$$

which low-pass filter dampers the voltage surges formed in the resonant frequencies of the coil assembly to such an extent that the above oscillation conditions of Equations (1) and (2) can not be satisfied at these frequencies.

BRIEF DESCRIPTION OF THE FIGURES

The above as well as other objects of the invention will become apparent when reading the accompanying description and drawings in which.

DETAILED DESCRIPTION OF THE INVENTION

Figure 1:
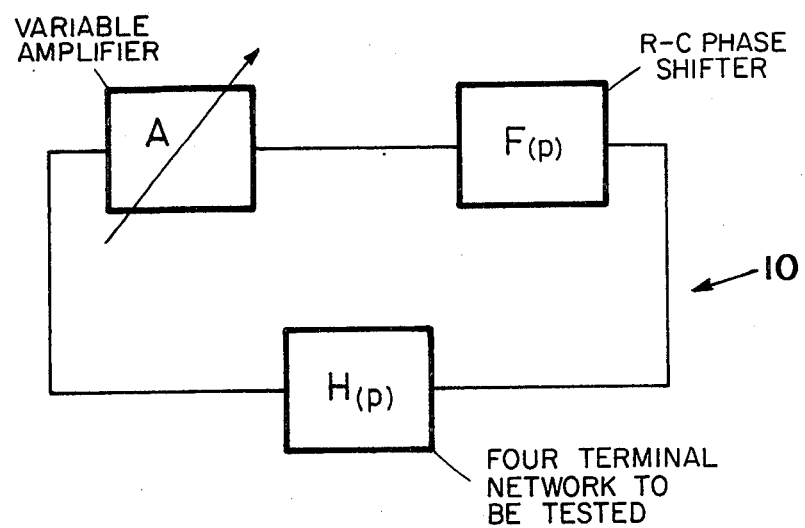
FIG. 1 shows a simplified block diagram of the basic design of the oscillator circuit of the present invention.

FIG. 1 shows the principal design of the circuit 10. H(p) represents the transmission function of the unknown - in this case inductive - four terminal network and F(p) represents the R-C phase shifter transfer function. A is set by regulation so that Equation (2) is satisfied. The function F(p) is here realized by a three-member, decoupled R-C low-pass filter (corresponding to $F(p) = 1/(1 + pT)^3$, as set forth above). Due to the increased damping with rising frequency, an oscillation of the coil at the self-resonant frequencies is here prevented, thanks to the use of the low-pass filter.

Since a single signal flows throughout the circuit 10, the signal whose frequency $f_o$ is representative of the phase shift of the four terminal network can be detected at any point in the circuit.

Figure 2:
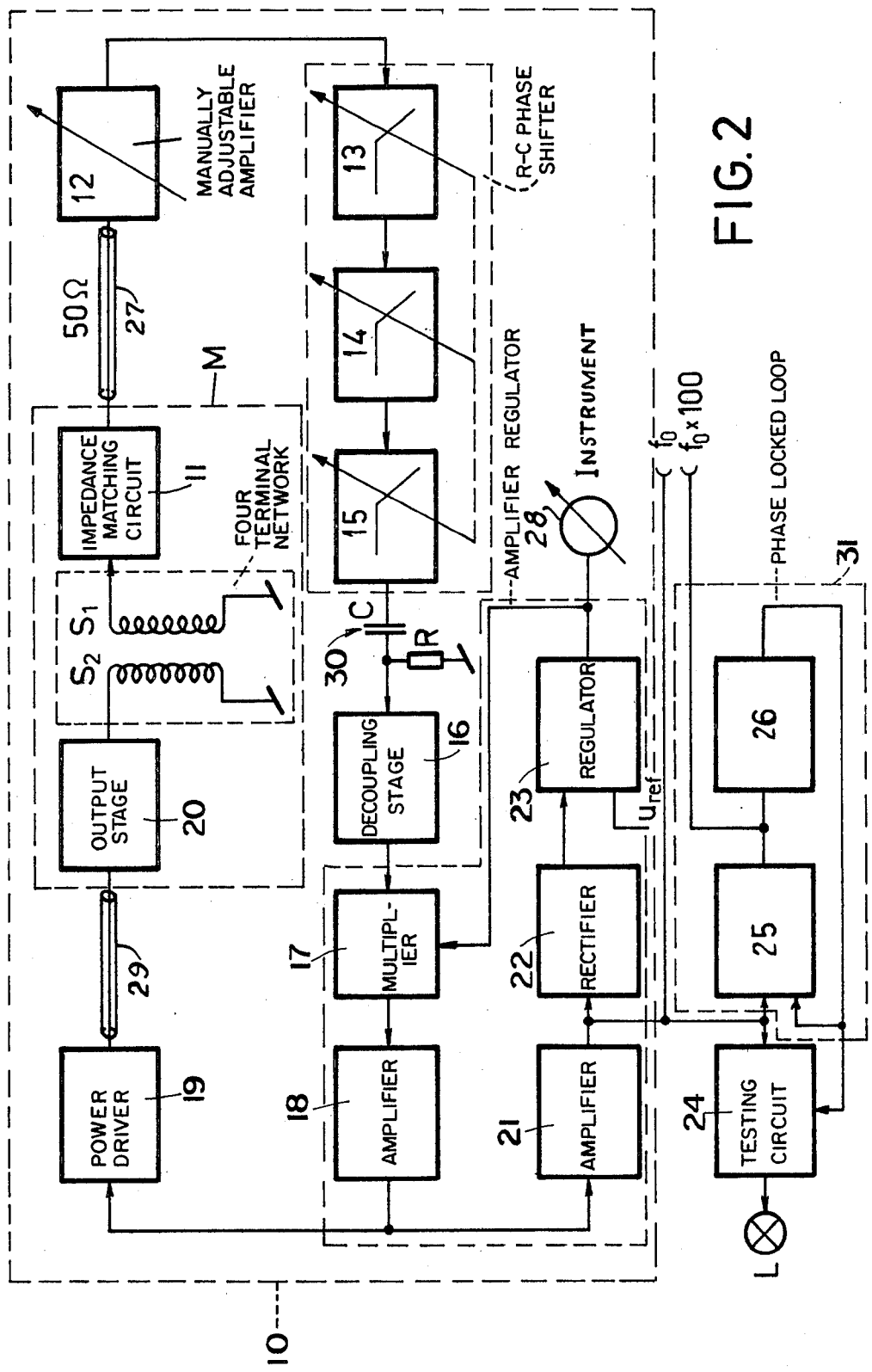
FIG. 2 shows a detailed block diagram of the oscillator.

FIG. 2 shows a block diagram of a phase angle-measuring instrument which may be employed as a temperature measuring instrument and utilizing the eddy current principle. The impedance of the detector coil S-1 is adapted with impedance matching circuit 11 to the impedance of the 50-Ohm cable 27. 12 represents a manually adjustable amplifier stage, while the stages 13, 14 and 15 form the three-member RC low-pass filter having the transfer function F(p) as given above. A d-c voltage component, if any, is separated by the RC filter 30. Stage 16 decouples the RC filter from multiplier 17, which together with regulator 23, insures that the amplitude condition according to Equation (2) is satisfied (i.e. factor A). The size of the amplification factor set by means of the multiplier is read on the instrument 28, and, if desired, can be brought to a suitable value by varying the amplification factor of amplifier 12 (in stages). The actual value for the regulator 23 is supplied by the amplifier 21 and the rectifier 22. 18 is another amplifier, while stage 19 acts as a power driver for the coaxial cable 29. 20 is the output stage for the coil S-2. 25 and 26 cooperatively form a phase-locked loop circuit 31 (hereinafter the PLL circuit) which multiplies the frequency $f_o$ generated by the oscillator circuit 10 (comprised of elements 11–23) by hundreds. This circuit permits the measuring time to be shortened by a factor of 100 when measuring the frequency according to the frequency counting method, with relatively no change in measuring accuracy. The PLL circuit also acts as a tracking filter and eliminates any interfering voltages collected by the detector coil, due to the filter time constant. The testing unit 24 permits a visual determination by way of signal lamp L of the fact that the PLL circuit is in synchronism with the oscillator frequency $f_o$. The primary coil $S_2$ is fed preferably by using a source which produces a constant alternating current, preventing the appearance of temperature-related resistance variations in the primary coil winding, and thus preventing undesired fluctuations of the coil time constant.

With the above described arrangement it is also possible to measure phase angles between the voltages, at the input and output of a four terminal network, with great resolution and reproducibility even when interference voltages are superimposed on the voltage being measured. After calibration, it is also possible to make absolute measurements. Numerous applications such as contact-free temperature measurement and material testing are possible. Non-contact temperature measurement utilizes the eddy current technique, for example, as described in detail in U.S. Pat. No. 3,936,734, issued Feb. 3, 1976 and assigned to the assignee of the present application. As described therein, a coil arrangement is employed in which an excitation winding and two concentrically arranged detection coils are provided. The detector coils are arranged in phase opposition. A magnetic field developed at right angles to the axis of the excitation coil is developed by the excitation coil in order to develop eddy currents within a test sample which, in turn, develops voltages in the detector coils. The phase angle between the current in the primary coil and that in the detector coil induced voltage is dependent upon the electrical conductivity of the test sample at the point of measurement, the coils being arranged so that one end thereof is brought adjacent to the surface of the test sample and so that the axes of the coils are substantially coincident and perpendicular to the surface of the test sample. Subject to the temperature dependance of the electrical conductivity of the test sample, the present invention can be utilized to determine the temperature of most metals.

The electrical conductivity is also affected by cracks or flaws or mechanical stresses within the metal being tested and hence using the arrangement of the invention, faults within the material can also consequently be ascertained.

By mounting the coils within the region M upon a suitable guide means for accurate movement and hence positioning toward or away from a test sample, the techniques described in the aforementioned U.S. Pat. No. 3,936,734 may be utilized to great advantage with the apparatus of the present invention, wherein the coils S2 and S1 (FIG. 2) respectively function as the excitation coil and the detector coil.

In an actually realized instrument (corresponding to FIG. 2) we achieved a sensitivity of $\sim 0.1$ Hz/$10^{-5}$ rad $f_o \times 100$). The measuring frequency was at 1.6 kHz.

What is claimed is:

1. In an oscillator circuit of the type which generates a signal whose frequency is representative of the phase shift of an inductive four terminal network, which network is located, in series with an amplifier/regulator means, in the feed back circuit of an RC phase shifter oscillator and is dimensioned to satisfy the following conditions:

$$\phi(\omega) + \phi = 0 \text{ (or integral multiples of } 2\pi) \tag{1}$$

$$|F(\omega)| \cdot |H| \cdot A = | \tag{2}$$

wherein $\phi(\omega)$ is the phase shift of the RC phase shifter, $\phi$ is the phase shift of the inductive four terminal network, $F(\omega)$ is the damping of the RC phase shifter, H is the damping of the inductive four terminal network and A is a real amplification factor which is controlled by said regulator means to satisfy equation (2), the improvement comprising: a three-member decoupled RC low-pass filter having a transmission function $F(p) = 1/(1+pT)^3$, said low-pass filter defining said RC phase shifter such that said low-pass filter dampers voltage surges generated at the resonant frequencies of said inductive four terminal network in such a way that the above Equations (1) and (2) are not satisfied at the resonant frequencies.

2. The oscillator circuit of claim 1 further including a frequency multiplier means in the form of a phase-locked loop circuit, which means multiplies the frequency of said signal generated by said oscillator circuit by a factor of $n$ in order that the time required to measure the frequency of said signal is reduced.

3. The oscillator circuit of claim 2 wherein said factor $n = 100$.

4. The oscillator circuit of claim 1 wherein said inductive four terminal network includes a primary and a secondary coil, said coils being adapted to measure the electrical conductivity of a metal sample placed in proximity to the coils by means of eddy currents induced in the metal sample by the primary coil, the phase difference between the voltages in said primary and secondary coils being indicative of some characteristic of said metal sample.

5. The circuit of claim 4 wherein said phase difference between said signal in said primary and said secondary coil is indicative of the temperature of said metal.

6. The oscillator circuit according to claim 4 wherein said coils do not contact said metal sample.

* * * * *